(12) United States Patent
Bang et al.

(10) Patent No.: US 11,600,679 B2
(45) Date of Patent: Mar. 7, 2023

(54) DISPLAY APPARATUS

(71) Applicant: SAMSUNG DISPLAY CO., LTD., Yongin-si (KR)

(72) Inventors: Hyunchol Bang, Yongin-si (KR); Chulkyu Kang, Yongin-si (KR); Jinwoo Park, Yongin-si (KR); Dongsun Lee, Yongin-si (KR); Sangmoo Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/250,090

(22) Filed: Jan. 17, 2019

(65) Prior Publication Data

US 2019/0280076 A1 Sep. 12, 2019

(30) Foreign Application Priority Data

Mar. 9, 2018 (KR) .................. 10-2018-0028259

(51) Int. Cl.
*H01L 27/32* (2006.01)
*H01L 27/12* (2006.01)

(52) U.S. Cl.
CPC ........ *H01L 27/3276* (2013.01); *H01L 27/124* (2013.01); *H01L 27/3258* (2013.01); *H01L 27/3265* (2013.01); *H01L 27/3272* (2013.01)

(58) Field of Classification Search
CPC ............... H01L 27/3276; H01L 27/124; H01L 27/3288; H01L 27/3258
See application file for complete search history.

(56) References Cited

U.S. PATENT DOCUMENTS 9,231,000 B2   1/2016  Ko et al.
10,109,694 B2  10/2018 Jung et al.
(Continued)

FOREIGN PATENT DOCUMENTS

CN     106549023    3/2017
EP     1298634 A2   4/2003
(Continued)

OTHER PUBLICATIONS

Extended European Search Report issued by the European Patent Office dated Jul. 23, 2019 in corresponding European Patent Application No. 19161677.0.
(Continued)

*Primary Examiner* — Michele Fan
(74) *Attorney, Agent, or Firm* — F. Chau & Associates, LLC

(57) ABSTRACT

A display apparatus includes a first transistor, a first data line, a second data line, a driving voltage line, and a first insulating layer. The first transistor includes a first semiconductor layer and a first gate electrode. The first semiconductor layer includes a source region and a drain region. The first data line is disposed at a left side of the first transistor, and the second data line is disposed at a right side of the first transistor. The driving voltage line at least partially overlaps the first data line and the second data line. The first insulating layer is disposed between the first data line and the driving voltage line and between the second data line and the driving voltage line.

16 Claims, 12 Drawing Sheets

(56) References Cited

U.S. PATENT DOCUMENTS

| | | | |
|---|---|---|---|
| 2003/0057419 A1* | 3/2003 | Murakami | H01L 29/458 257/72 |
| 2003/0059986 A1* | 3/2003 | Shibata | H01L 29/78696 438/149 |
| 2003/0231149 A1 | 12/2003 | Kawamura et al. | |
| 2004/0178977 A1* | 9/2004 | Nakayoshi | G09G 3/3677 345/87 |
| 2005/0243255 A1* | 11/2005 | Ono | G02F 1/134363 349/141 |
| 2006/0125741 A1* | 6/2006 | Tanaka | G09G 3/3233 345/79 |
| 2009/0170230 A1 | 7/2009 | Kidu et al. | |
| 2011/0241526 A1 | 10/2011 | Huang et al. | |
| 2011/0304789 A1* | 12/2011 | Jung | G09G 3/3648 349/38 |
| 2012/0162181 A1* | 6/2012 | Chuang | G09G 3/3614 345/212 |
| 2012/0273785 A1* | 11/2012 | Moriguchi | H01L 27/14692 257/53 |
| 2012/0292627 A1* | 11/2012 | Moriguchi | H01L 27/14678 257/E29.273 |
| 2013/0335456 A1* | 12/2013 | Matsui | G09G 3/30 345/690 |
| 2014/0167036 A1* | 6/2014 | Cheng | H01L 29/78621 257/43 |
| 2014/0239270 A1* | 8/2014 | Ko | H01L 27/3265 257/40 |
| 2016/0099262 A1* | 4/2016 | Lin | H01L 27/1222 257/43 |
| 2016/0210896 A1* | 7/2016 | Gil | H01L 27/3265 |
| 2016/0217744 A1 | 7/2016 | Song et al. | |
| 2016/0260376 A1* | 9/2016 | Shin | G09G 3/3225 |
| 2017/0053975 A1* | 2/2017 | Cho | H01L 27/1255 |
| 2017/0140706 A1* | 5/2017 | Song | G09G 3/3233 |
| 2017/0141177 A1* | 5/2017 | Kim | G09G 3/3258 |
| 2017/0200781 A1 | 7/2017 | Jin | |
| 2017/0220148 A1 | 8/2017 | Zhou et al. | |
| 2017/0249896 A1 | 8/2017 | Kim et al. | |
| 2017/0345877 A1* | 11/2017 | Hwang | H01L 27/3276 |
| 2018/0081756 A1* | 3/2018 | Akasawa | G09G 3/32 |
| 2018/0114823 A1* | 4/2018 | Lee | G09G 3/3241 |
| 2019/0369452 A1* | 12/2019 | Long | G02F 1/13624 |
| 2020/0005692 A1* | 1/2020 | Hu | G09G 3/006 |

FOREIGN PATENT DOCUMENTS

| | | |
|---|---|---|
| KR | 10-2009-0072998 | 7/2009 |
| KR | 10-2014-0108023 | 9/2014 |
| KR | 10-2017-0012756 | 2/2017 |
| KR | 10-2017-0102147 | 9/2017 |

OTHER PUBLICATIONS

Office Action issued by the European Patent Office dated Oct. 29, 2021 in corresponding European Patent Application No. 19161677.0.

* cited by examiner

DISPLAY APPARATUS

CROSS-REFERENCE TO RELATED APPLICATIONS

This application claims priority under 35 U.S.C. § 119 to Korean Patent Application No. 10-2018-0028259, filed on Mar. 9, 2018, the disclosure of which is incorporated by reference herein in its entirety.

TECHNICAL FIELD

Exemplary embodiments of the present disclosure relate to a display apparatus, and more particularly, to a display apparatus including a structure in which two data lines are arranged in one pixel.

DISCUSSION OF THE RELATED ART

Organic light-emitting diode (OLED) display devices have a self-emissive characteristic and reduced thickness and weight compared to liquid crystal display (LCD) devices, since OLED display devices do not require an additional light source. In addition, OLED display devices exhibit excellent characteristics such as low power consumption, high luminance, and rapid response speed. When a display device has high resolution, a line time for driving one row is reduced, and a time taken to compensate for a threshold voltage of a driving transistor is reduced.

SUMMARY

Exemplary embodiments of the present disclosure include a pixel structure capable of ensuring a sufficient amount of time for compensating for a threshold voltage and a sufficient amount of time for storing data signals, while overcoming spatial limitation of a display apparatus.

According to an exemplary embodiment of the present disclosure, a display apparatus includes a first transistor, a first data line, a second data line, a driving voltage line, and a first insulating layer. The first transistor includes a first semiconductor layer and a first gate electrode. The first semiconductor layer includes a source region and a drain region. The first data line is disposed at a left side of the first transistor, and the second data line is disposed at a right side of the first transistor. The driving voltage line at least partially overlaps the first data line and the second data line. The first insulating layer is disposed between the first data line and the driving voltage line and between the second data line and the driving voltage line.

In an exemplary embodiment, the first insulating layer includes an organic material.

In an exemplary embodiment, the driving voltage line includes a first region that overlaps the first data line in a first row, a second region that overlaps the second data line in a second row that is adjacent to the first row, and a third region that connects the first region to the second region between the first row and the second row.

In an exemplary embodiment, the display apparatus further includes a capacitor that overlaps the first transistor and is disposed between the first data line and the second data line.

In an exemplary embodiment, the capacitor includes a lower electrode and an upper electrode, and the lower electrode is at least a part of the first gate electrode of the first transistor.

In an exemplary embodiment, the upper electrode of the capacitor is electrically connected to the driving voltage line.

In an exemplary embodiment, the upper electrode of the capacitor is disposed below the driving voltage line.

In an exemplary embodiment, the display apparatus further includes a second insulating layer disposed on an upper surface of the first data line and the second data line, and a light-emitting device disposed on an upper surface of the second insulating layer.

In an exemplary embodiment, the second insulating layer includes an organic material.

In an exemplary embodiment, the first data line, the second data line, and the driving voltage line include a same material.

In an exemplary embodiment, the first data line and the second data line include a material that is different from a material included in the driving voltage line.

In an exemplary embodiment, the display apparatus further includes a second transistor including a second semiconductor layer and a second gate electrode, in which the second semiconductor layer includes a source region and a drain region, a connection electrode disposed adjacent to the second semiconductor layer, and a shielding member that at least partially overlaps the connection electrode and at least one of the source region and the drain region of the second semiconductor layer. The source region or the drain region of the second semiconductor layer is electrically connected to the first gate electrode of the first transistor.

In an exemplary embodiment, the shielding member is electrically connected to the driving voltage line.

In an exemplary embodiment, the shielding member is disposed between the second semiconductor layer and the connection electrode, and a plurality of insulating layers are disposed between the second semiconductor layer and the shielding member and between the connection electrode and the shielding member.

According to an exemplary embodiment of the present disclosure, a display apparatus includes a semiconductor layer, a first insulating layer disposed on the semiconductor layer, a conductive layer disposed on the first insulating layer, a second insulating layer disposed on the conductive layer, a first power line that extends in a first direction on the second insulating layer, a third insulating layer disposed on the first power line, a second power line that extends in a second direction on the third insulating layer, in which the second direction is different from the first direction, a fourth insulating layer disposed on the second power line, and a first data line and a second data line disposed on the fourth insulating layer. The first data line and the second data line are spaced apart from each other. The second power line electrically contacts the first power line, and the second power line at least partially overlaps at least one of the first data line and the second data line.

In an exemplary embodiment, the display apparatus further includes a connection electrode and a shielding member. The connection electrode is disposed adjacent to a part of the semiconductor layer, and disposed on a same layer as the second power line. The shielding member overlaps the semiconductor layer and at least a part of the second power line, and is disposed at a same layer as the first power line.

In an exemplary embodiment, the shielding member is electrically connected to the second power line.

In an exemplary embodiment, the fourth insulating layer includes an organic material.

In an exemplary embodiment, the display apparatus further includes a fifth insulating layer disposed on the first data line and the second data line, and a light-emitting device disposed on the fifth insulating layer.

In an exemplary embodiment, the fifth insulating layer includes an organic material.

BRIEF DESCRIPTION OF THE DRAWINGS

The above and other features of the present disclosure will become more apparent by describing in detail exemplary embodiments thereof with reference to the accompanying drawings, in which.

DETAILED DESCRIPTION

Figure 1:
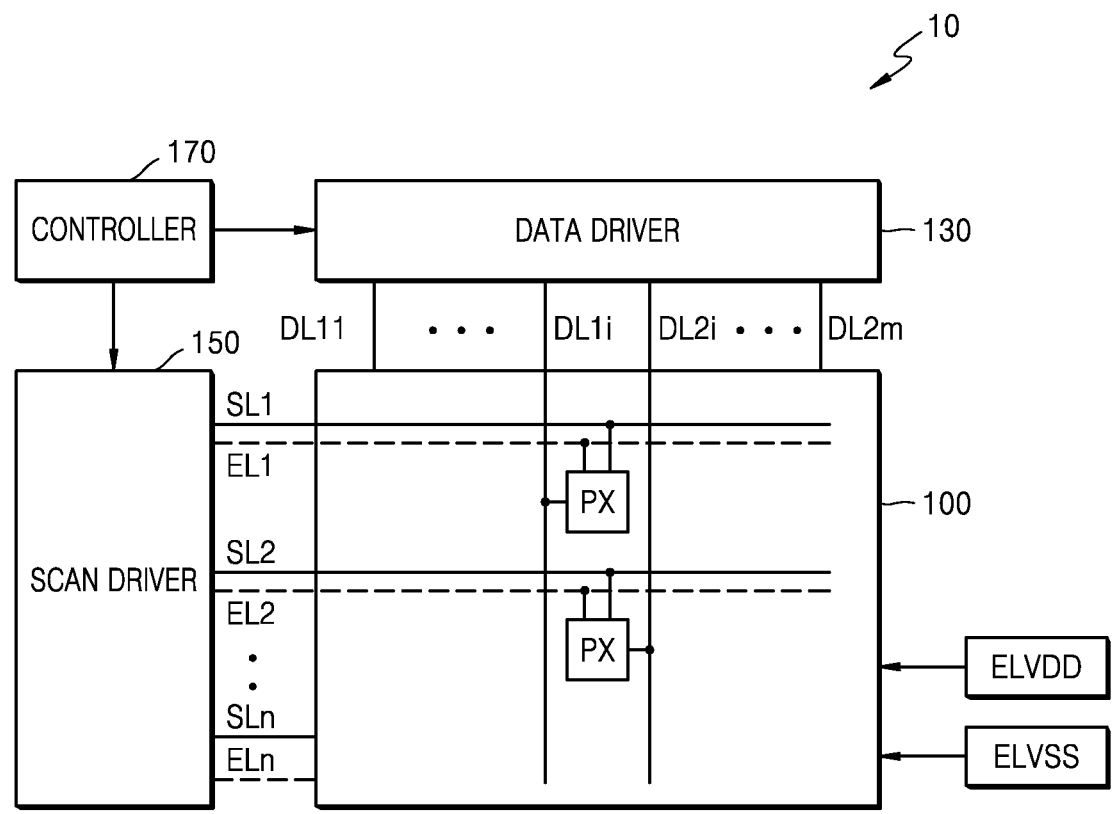
FIG. 1 is a schematic diagram of a display apparatus according to an exemplary embodiment of the present disclosure.

Exemplary embodiments of the present disclosure will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an exemplary embodiment may be described as a "second" element in another exemplary embodiment. In addition, as used herein, the singular forms "a", "an" and "the" are intended to include the plural forms as well, unless the context clearly indicates otherwise.

It will be understood that when a layer, region, or component is referred to as being "formed on" or "under" another layer, region, or component, it can be directly or indirectly formed on or under the other layer, region, or component. That is, for example, intervening layers, regions, or components may be present.

In the present specification, the terms such as "correspond" or "to correspond" may denote arranging in the same column or row, or being connected. For example, when a first member is connected to a "corresponding" second member from among a plurality of second members, it denotes that the first member is connected to a second member arranged in the same column or the same row as that of the first member.

FIG. 1 is a schematic diagram of a display apparatus 10 according to an exemplary embodiment of the present invention.

Referring to FIG. 1, in an exemplary embodiment, the display apparatus 10 includes a pixel portion 100, a data driver 130, a scan driver 150, and a controller 170. The display apparatus 10 may be, for example, an organic light-emitting diode (OLED) display apparatus. However, the display apparatus 10 is not limited thereto.

The pixel portion 100 includes a plurality of scan lines SL1 to SLn, a plurality of data lines DL11 to DL2m, a plurality of light-emission control lines EL1 to ELn, and a plurality of pixels PX.

Figure 2:
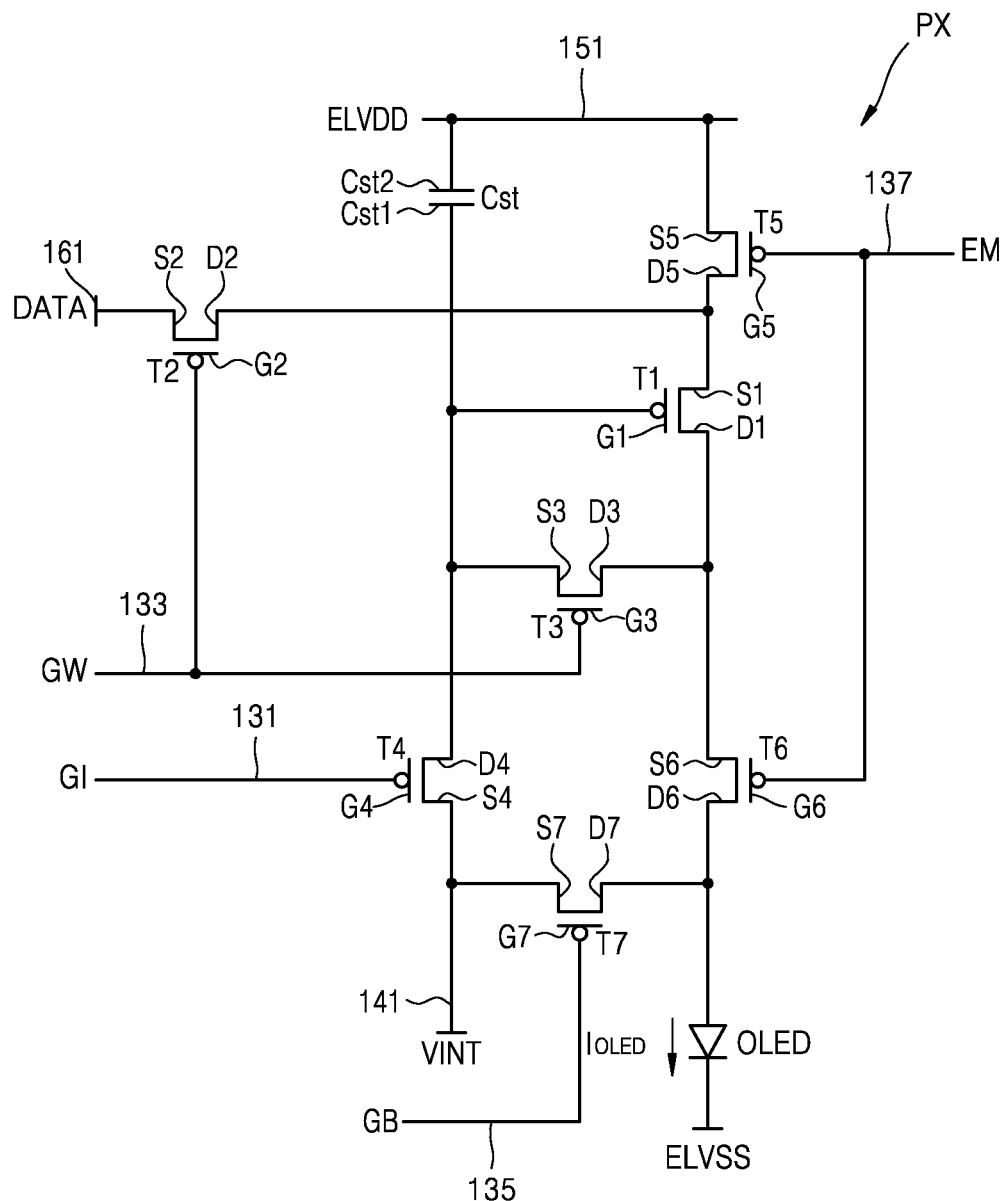
FIG. 2 is an equivalent circuit diagram of a pixel according to an exemplary embodiment of the present disclosure.

The plurality of scan lines SL1 to SLn is arranged in rows, and each scan line transfers a scan signal. As shown in FIG. 2, in an exemplary embodiment, the scan lines connected to each pixel include a first scan line 131 that applies a first scan signal GI, a second scan line 133 that applies a second scan signal GW, and a third scan line 135 that applies a third scan signal GB.

Figure 3:
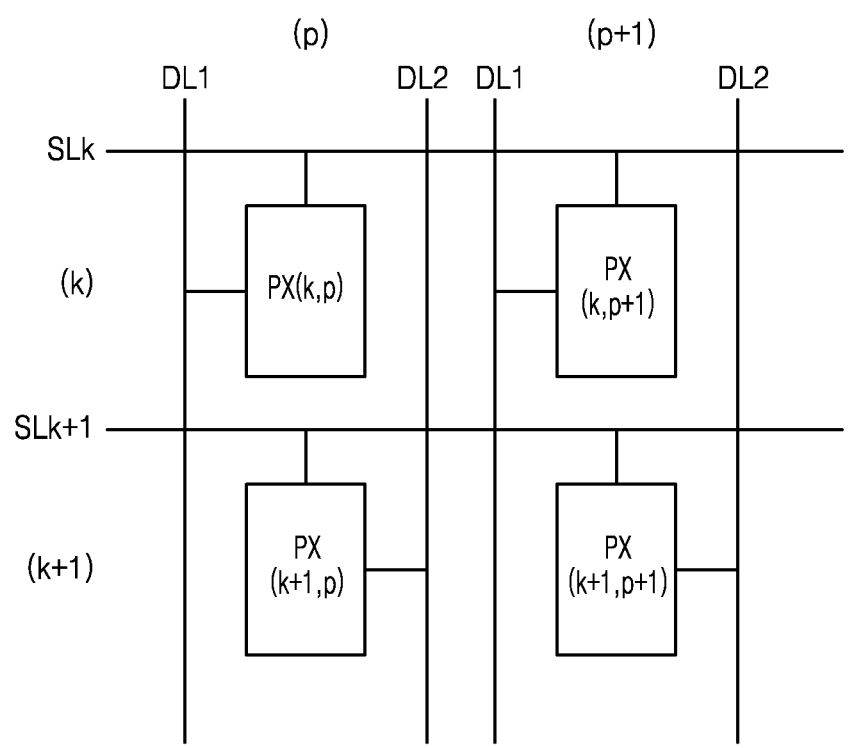
FIG. 3 is a schematic diagram of a pixel arrangement according to an exemplary embodiment of the present disclosure.

The plurality of data lines DL11 to DL2m is arranged in columns, and the data lines DL11 to DL2m respectively transfer data signals. As shown in FIG. 3, in an exemplary embodiment, two data lines are arranged in one column. The two data lines in each column include a first data line DL1 connected to a pixel PX of an odd-numbered row, and a second data line DL2 connected to a pixel PX of an even-numbered row. The first and second data lines DL1 and DL2 adjacent to each other are alternately connected to the pixels PX located in the same column.

The plurality of scan lines SL1 to SLn and the plurality of data lines DL11 to DL2m are arranged as a matrix, and the pixels PX are arranged at cross-sections thereof. The pixels PX may include first pixels, second pixels, and third pixels that emit light of different colors from one another. For example, in an exemplary embodiment, the first pixel is a red pixel R that emits red light, the second pixel is a blue pixel B that emits blue light, and the third pixel is a green pixel G that emits green light. The first, second, and third pixels may be arranged according to a predetermined rule. For example, in an exemplary embodiment, the first and second pixels may be arranged alternately in a column, and the third pixels may be arranged in a column adjacent to the column in which the first and second pixels are arranged.

The light-emission control lines EL1 to ELn respectively transfer light-emitting control signals. A first power voltage ELVDD and a second power voltage ELVSS are applied to each of the pixels PX in the pixel portion 100. In an exemplary embodiment, a voltage level of the second power voltage ELVSS is lower than a voltage level of the first power voltage ELVDD.

The data driver 130 is connected to the plurality of data lines DL11 to DL2m. The data driver 130 converts image data to a data signal of a voltage or a current type in response to a control signal received from the controller 170. The data driver 130 applies the data signal to the plurality of data lines DL11 to DL2m.

In response to receiving the control signal from the controller 170, the data driver 130 sequentially supplies the data signal to the first data lines DL11 to DL1m during a first horizontal period, and sequentially supplies the data signal to the second data lines DL21 to DL2m during a second horizontal period. The second horizontal period may be equal to the first horizontal period. For example, a second scan signal GW may be simultaneously supplied to a pair of pixels in an odd-numbered row and an even-numbered row, and the data driver 130 may supply the data signals to the first and second data lines DL1 and DL2 during the above period. That is, according to an exemplary embodiment, two data lines are arranged in one pixel, and the second scan signal GW is simultaneously supplied to a pair of pixels in an odd-numbered row and an even-numbered row, thereby increasing a supply time of the second scan signal GW. Thus, according to exemplary embodiments of the present disclosure, a sufficient amount of time for compensating for the threshold voltage and storing the data signal is provided, and image quality characteristics may be improved.

The scan driver 150 is connected to the plurality of scan lines SL1 to SLn, and generates a scan signal in response a control signal from the controller 170 to supply the scan signal to the scan lines SL1 to SLn. In addition, the scan driver 150 is connected to the plurality of light-emission control lines EL1 to ELn, and generates a light-emitting control signal in response to a control signal from the controller 170 to supply the light-emitting control signal to the light-emission control lines EL1 to ELn. In the exemplary embodiment illustrated with reference to FIG. 1, the scan driver 150 generates and applies the light-emitting control signal to the pixel portion 100. However, exemplary embodiments of the present disclosure are not limited thereto. For example, in an exemplary embodiment, an additional light-emitting control driver may be utilized to generate and apply the light-emitting control signal to the pixel portion 100.

The controller 170 generates a plurality of control signals in response to synchronization signals supplied from outside. The controller 170 outputs a control signal for controlling the data driver 130 to the data driver 130, and outputs a control signal for controlling the scan driver 150 to the scan driver 150. In an exemplary embodiment, the controller 170 controls the supplying of the control signals such that the data signals are supplied in units of a pair of rows (e.g., an adjacent odd-numbered row and even-numbered row).

FIG. 2 is an equivalent circuit diagram of a pixel PX according to an exemplary embodiment of the present disclosure.

Referring to FIG. 2, in an exemplary embodiment, the pixel PX includes a pixel circuit including first to seventh transistors T1 to T7 and a capacitor Cst, and a light-emitting device connected to the pixel circuit. The light-emitting device may be, for example, an organic light-emitting diode OLED.

The pixel PX includes signal lines 131, 133, 135, 137, and 161, the first to seventh transistors T1 to T7, the capacitor Cst connected to the signal lines 131, 133, 135, 137, and 161, an initialization voltage line 141, a driving voltage line 151, and an organic light-emitting diode OLED. Herein, the terms "signal line" and "scan line" may be used interchangeably.

The pixel PX is connected to the first scan line 131 that transfers the first scan signal GI to the fourth transistor T4, the second scan line 133 that transfers the second scan signal GW to the second and third transistors T2 and T3, the third scan line 135 that transfers the third scan signal GB to the seventh transistor T7, the light-emission control line 137 that transfers the light-emitting control signal EM to the fifth and sixth transistors T5 and T6, the data line 161 that transfers a data signal DATA, the driving voltage line 151 that transfers the first power voltage ELVDD, and the initialization voltage line 141 that transfers an initialization voltage VINT that initializes the first transistor T1. The data line 161 may be, for example, the odd-numbered data line DL1 or the even-numbered data line DL2 (see FIG. 3).

The first transistor T1 includes a gate electrode G1 connected to a lower electrode Cst1 of the capacitor Cst, a first electrode S1 connected to the driving voltage line 151 via the fifth transistor T5, and a second electrode D1 electrically connected to a first electrode of the organic light-emitting diode OLED via the sixth transistor T6. The first transistor T1 acts as a driving transistor, and receives a data signal to supply an electric current to the organic light-emitting diode OLED according to a switching operation of the second transistor T2.

The second transistor T2 includes a gate electrode G2 connected to the second scan line 133, a first electrode S2 connected to the data line 161, and a second electrode D2 connected to the first electrode S1 of the first transistor T1. The second transistor T2 is turned on according to the second scan signal GW transferred through the second scan line 133 to perform a switching operation for transferring the data signal transferred through the data line 161 to the first electrode S1 of the first transistor T1.

The third transistor T3 includes a gate electrode G3 connected to the second scan line 133, a second electrode D3 connected to the second electrode D1 of the first transistor T1, and a first electrode S3 connected to the lower electrode Cst1 of the capacitor Cst, a second electrode D4 of the fourth transistor T4, and the gate electrode G1 of the first transistor T1. The third transistor T3 is turned on according to the second scan signal GW transferred through the second scan line 133 to perform diode-connection of the first transistor T1.

The fourth transistor T4 includes a gate electrode G4 connected to the first scan line 131, a first electrode S4 connected to the initialization voltage line 141, and the second electrode D4 connected to the lower electrode Cst1 of the capacitor Cst, the first electrode S3 of the third transistor T3, and the gate electrode G1 of the first transistor T1. The fourth transistor T4 is turned on according to the first scan signal GI transferred through the first scan line 131 to perform an initialization operation for initializing a gate voltage of the first transistor T1 by transferring the initialization voltage VINT to the gate electrode G1 of the first transistor T1.

The fifth transistor T5 includes a gate electrode G5 connected to the light-emission control line 137, a first electrode S5 connected to the driving voltage line 151, and a second electrode D5 connected to the first electrode S1 of the first transistor T1 and the second electrode D2 of the second transistor T2.

The sixth transistor T6 includes a gate electrode G6 connected to the light-emission control line 137, a first electrode S6 connected to the second electrode D1 of the first transistor T1 and the second electrode D3 of the third transistor T3, and a second electrode D6 connected to the first electrode of the organic light-emitting diode OLED.

The fifth transistor T5 and the sixth transistor T6 are simultaneously turned on according to the light-emitting control signal EM transmitted through the light-emission control line 137 to make the electric current flow through the organic light-emitting diode OLED. The electric current flowing through the organic light-emitting diode OLED is referred to as $T_{OLED}$ in FIG. 2.

The seventh transistor T7 includes a gate electrode G7 connected to the third scan line 135, a first electrode S7 connected to the initialization voltage line 141, and a second electrode D7 connected to the second electrode D6 of the sixth transistor T6 and the first electrode of the organic light-emitting diode OLED. The seventh transistor T7 is turned on according to the third scan signal GB transmitted through the third scan line 135 to perform an initialization operation for initializing a voltage at the first electrode of the organic light-emitting diode OLED by transferring the initialization voltage VINT to the first electrode of the organic light-emitting diode OLED.

The third scan line 135 connected to the gate electrode G7 of the seventh transistor T7 may be the first scan line 131 of a next row or the second scan line 133 of the current row, and the third scan signal GB may be a first scan signal GI of the next row or a second scan signal GW of the current row.

The capacitor Cst includes the lower electrode Cst1 connected to the gate electrode G1 of the first transistor T1, the first electrode S3 of the third transistor T3, and the second electrode D4 of the fourth transistor T4, and an upper electrode Cst2 connected to the driving voltage line 151.

The organic light-emitting diode OLED includes the first electrode and the second electrode as described above, as well as an emission layer disposed between the first and second electrodes. The second electrode of the organic light-emitting diode OLED may be connected to an electric power supply that supplies the second power voltage ELVSS.

The first scan signal GI is supplied through the first scan line 131 to turn on the fourth transistor T4 during a first period. When the fourth transistor T4 is turned on, the initialization voltage VINT is supplied to the gate electrode G1 of the first transistor T1, and accordingly, the gate electrode G1 of the first transistor T1 is initialized to the initialization voltage VINT.

Next, in a second period, the second scan signal GW is supplied through the second scan line 133 to turn on the second and third transistors T2 and T3. When the third transistor T3 is turned on, the first transistor T1 is diode-connected. When the first transistor T1 is diode-connected, a data signal DATA and a voltage corresponding to a threshold voltage of the first transistor T1 are applied to the gate electrode G1 of the first transistor T1. When the second transistor T2 is turned on, the data signal DATA is transferred to the first electrode S1 of the first transistor T1 from the data line 161.

In addition, in the second period, the third scan signal GB is supplied through the third scan line 135 simultaneously with the second scan signal GW to turn on the seventh transistor T7. When the seventh transistor T7 is turned on, the first electrode of the organic light-emitting diode OLED is initialized to the initialization voltage VINT.

Subsequently, in a third period, the light-emitting control signal EM is supplied through the light-emission control line 137 to turn on the fifth and sixth transistors T5 and T6. Then, the first transistor T1 controls an amount of electric current flowing from the first power voltage ELVDD to the second power voltage ELVSS via the organic light-emitting diode OLED in response to the voltage applied to the gate electrode G1 of the first transistor T1. Here, the organic light-emitting diode OLED generates light of a predetermined luminance in response to the amount of electric current.

In an exemplary embodiment, the first scan signal GI, the second scan signal GW, and the third scan signal GB are simultaneously supplied to a pair of pixels PX in adjacent odd-numbered and even-numbered rows. For example, in an exemplary embodiment, a timing of supplying the first, second, and third scan signals GI, GW, and GB to a pixel of a first row and a timing of supplying the first, second, and third scan signals GI, GW, and GB to a pixel of a second row coincide with each other (e.g., are synchronized with each other), and a timing of supplying the first, second, and third scan signals GI, GW, and GB to a pixel of a third row and a timing of supplying the first, second, and third scan signals GI, GW, and GB to a pixel of a fourth row coincide with each other (e.g., are synchronized with each other).

FIG. 3 is a schematic diagram of a pixel arrangement according to an exemplary embodiment of the present disclosure.

FIG. 3 shows a pixel (PX(k,p)) in a row k and a column p, a pixel (PX(k,p+1)) in the row k and a column p+1, a pixel (PX(k+1,p)) in a row k+1 and the column p, and a pixel (PX(k+1,p+1)) in the row k+1 and the column p+1. Here, k and p are respectively odd numbers.

Referring to FIG. 3, in an exemplary embodiment, pixel circuits of the pixel PX connected to a scan line SLk of an odd-numbered row and the pixel PX connected to a scan line SLk+1 of an even-numbered row in each column are symmetric with each other. For example, in an exemplary embodiment, the first to seventh transistors T1 to T7 are arranged opposite in a lateral direction in the pixel (PX(k,p)) and in the pixel (PX(k+1,p)), and the first to seventh transistors T1 to T7 are arranged opposite in a lateral direction in the pixel (PX(k,p+1)) and in the pixel (PX(k+1,p+1)). However, connection relations among the first to seventh transistors T1 to T7 and the capacitor Cst are equivalent.

In an exemplary embodiment, in each column, the first data line DL1 and the second data line DL2 are arranged apart from each other. In an exemplary embodiment, the first data line DL1 and the second data line DL2 of two adjacent columns are adjacent to each other.

Figure 4:
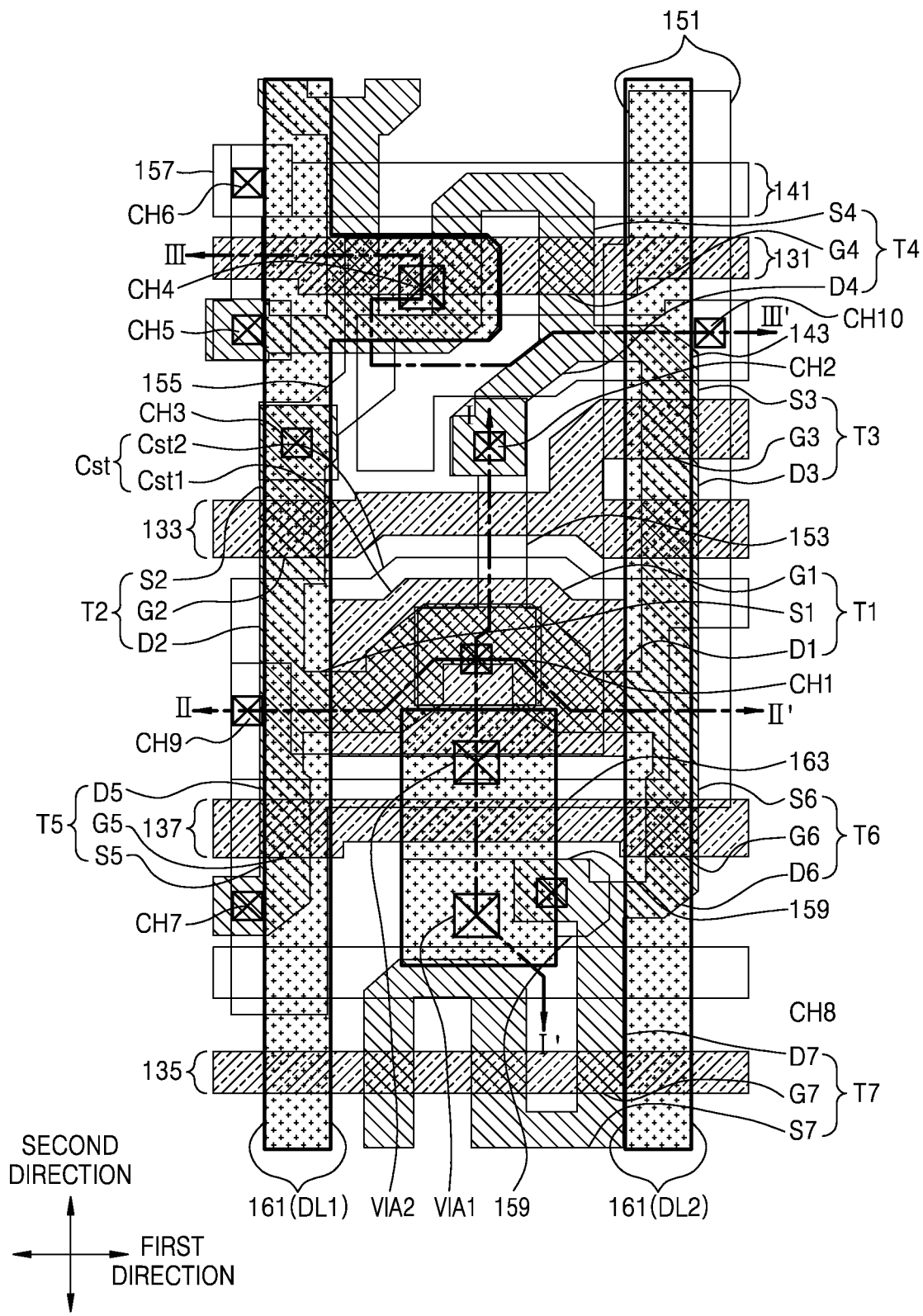
FIG. 4 is a diagram schematically showing locations of a transistor and a capacitor in the pixel of FIGS. 2 and 3.
Figure 5:
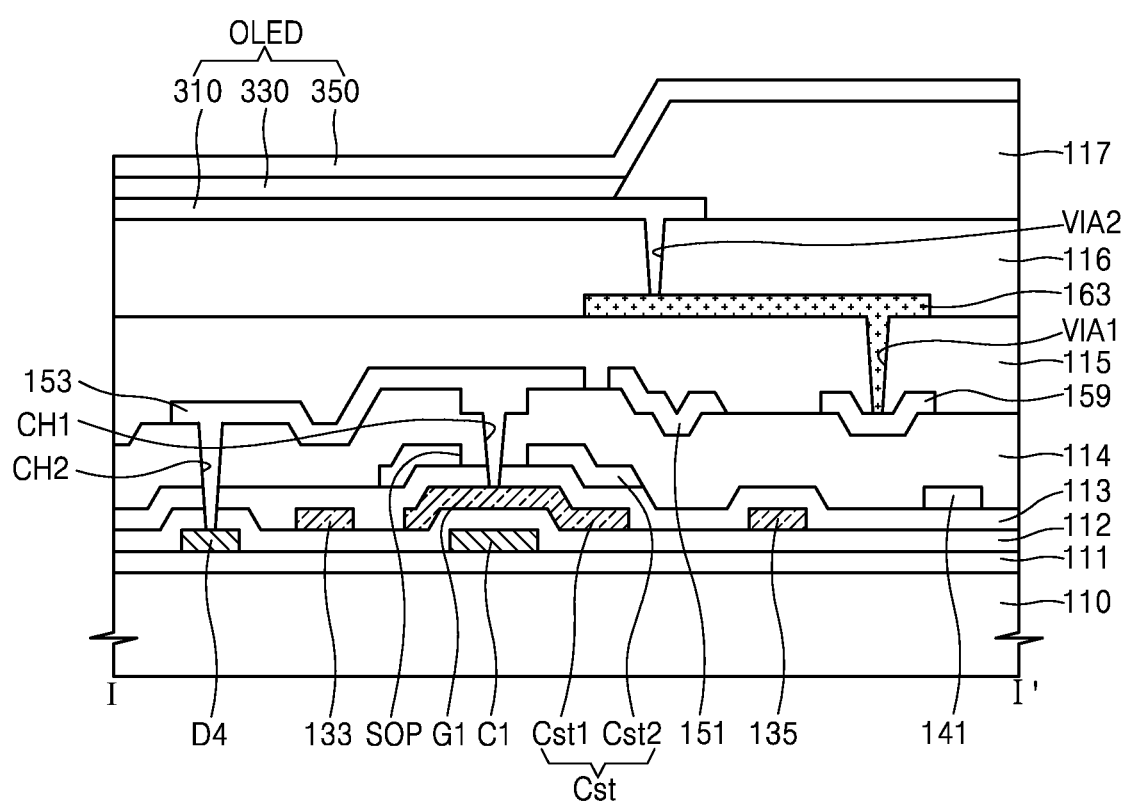
FIG. 5 is a cross-sectional view of a pixel taken along line I-I' of FIG. 4.
Figure 6:
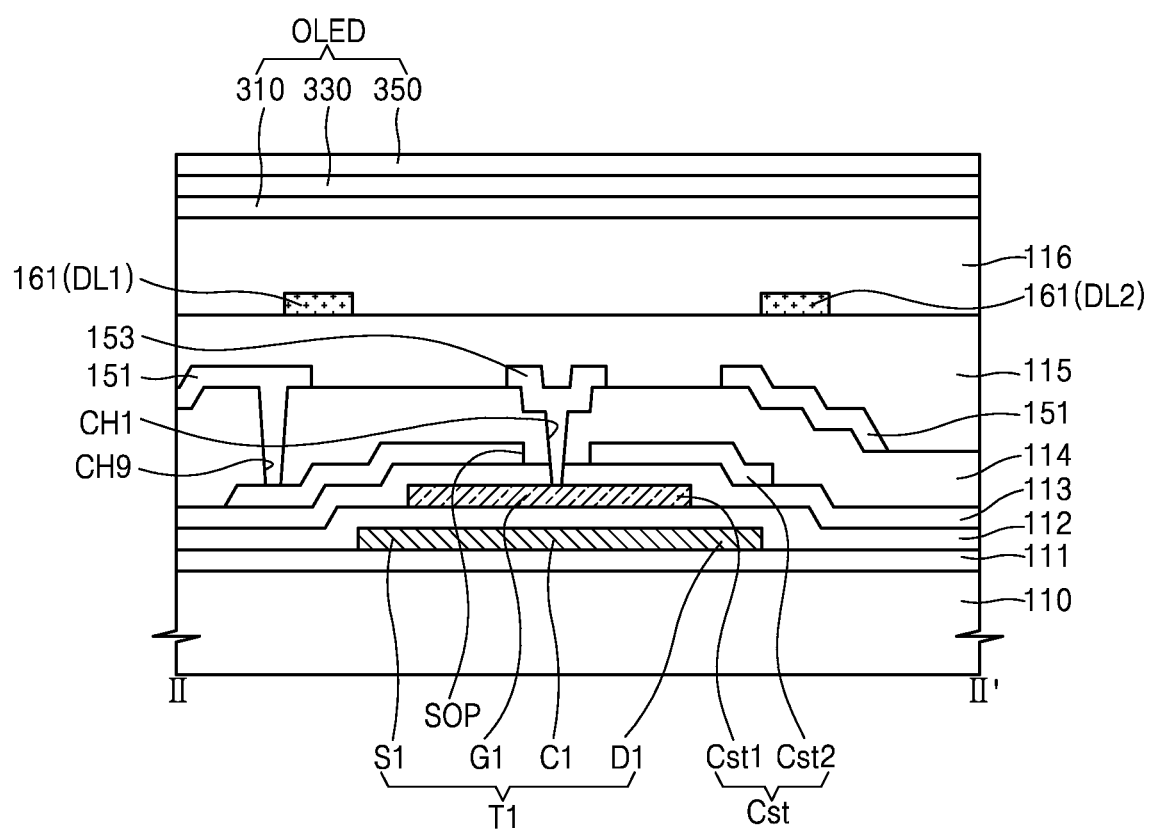
FIG. 6 is a cross-sectional view of a pixel taken along line II-II' of FIG. 4.
Figure 7:
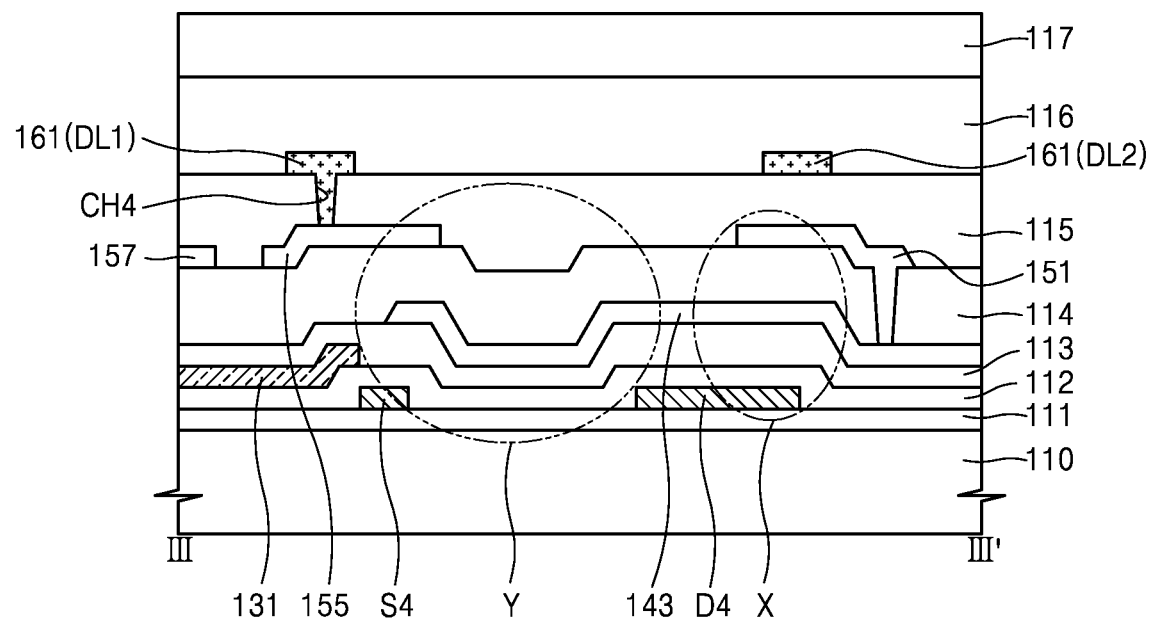
FIG. 7 is a cross-sectional view of a pixel taken along line III-III' of FIG. 4.
Figure 8:
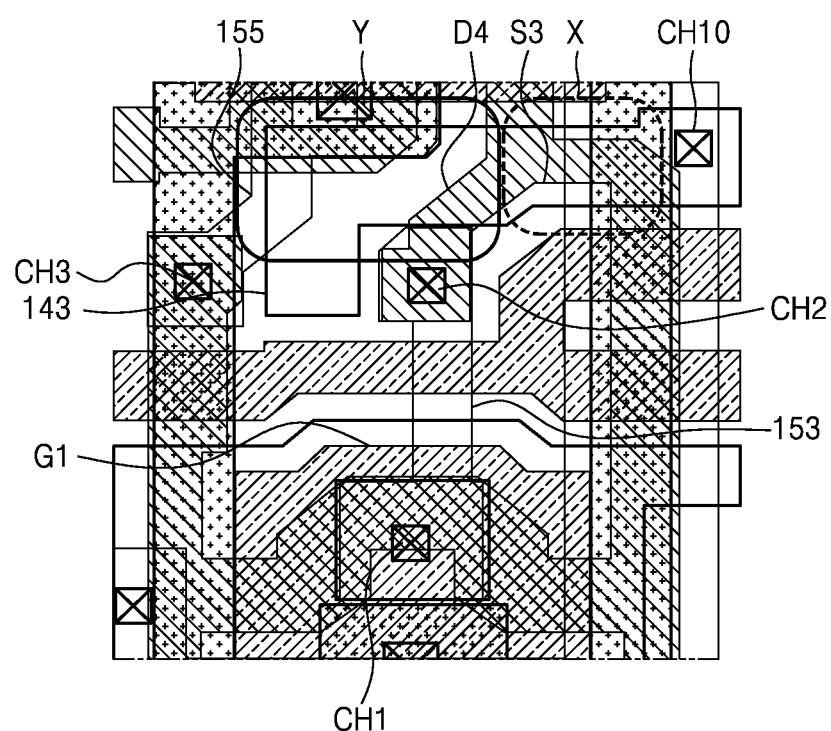
FIG. 8 is an enlarged view of a shielding member of FIG. 4.

FIG. 4 is a diagram schematically showing locations of a transistor and a capacitor in the pixel of FIGS. 2 and 3 according to an exemplary embodiment of the present disclosure. FIG. 5 is a cross-sectional view taken along line I-I' of FIG. 4. FIG. 6 is a cross-sectional view taken along line II-II' of FIG. 4. FIG. 7 is a cross-sectional view taken along line III-III' of FIG. 4. FIG. 8 is an enlarged view of a shielding member of FIG. 4. Hereinafter, descriptions will be provided with reference to FIGS. 4 to 7 together. FIGS. 5 to 7 show structures based on the first transistor T1 and the capacitor Cst, and for convenience of explanation, some components previously illustrated and described may be omitted.

Referring to FIG. 4, in an exemplary embodiment, the pixel PX of the display apparatus includes a plurality of wirings extending in a first direction, and a plurality of wirings extending in a second direction that crosses the first direction. The first scan line 131, the second scan line 133, the third scan line 135, the light-emission control line 137, and the initialization voltage line 141 extend in the first direction. The data line 161 and the driving voltage line 151 extend in the second direction.

In an exemplary embodiment, each of the first to seventh transistors T1 to T7 is a thin film transistor including a semiconductor layer including a source region, a drain region, and a channel region disposed between the source and drain regions, and a gate electrode arranged at a location corresponding to the channel region to be insulated from the semiconductor layer.

The first electrodes S1 to S7 and the second electrodes D1 to D7 of FIG. 2 may be the source region or the drain region according to the type of the transistor (p-type or n-type) and/or operating conditions. Hereinafter, the first electrode and the second electrode of the transistor shown in FIG. 2 will be denoted as a source region and a drain region of the transistor for convenience of description. However, exemplary embodiments of the present disclosure are not limited thereto. For example, in exemplary embodiments, the source and drain regions of the transistor shown in FIGS. 4 to 7 may be switched. For example, in an exemplary embodiment, the source region of the fourth transistor T4 may be also be interpreted as the drain region of the fourth transistor T4, taking into account the types and/or operating conditions of the fourth transistor T4 and the other transistors connected to the fourth transistor T4.

A buffer layer 111 is disposed on a substrate 110, and semiconductor layers of the first to seventh transistors T1 to T7 are arranged on the buffer layer 111.

The substrate 110 may include, for example, a glass material, a ceramic material, a metal material, a plastic material, or a flexible or bendable material. The substrate 110 may have a single-layered or a multi-layered structure of the above material, and the multi-layered structure may further include an inorganic layer. In exemplary embodiments, the substrate 110 has a structure including an organic material/inorganic material/organic material.

In an exemplary embodiment, the buffer layer 111 may include an oxide layer such as, for example, silicon oxide (SiOx), and/or a nitride layer such as, for example silicon nitride (SiNx). In an exemplary embodiment, the buffer layer 111 may be omitted.

The semiconductor layers of the first to seventh transistors T1 to T7 are arranged at the same layer, and may include the same material as one another. For example, the semiconductor layers may include polycrystalline silicon. The semiconductor layers of the first to seventh transistors T1 to T7 may be connected to one another, and may be curved in various shapes. The semiconductor layer of each of the first to seventh transistors T1 to T7 may include the channel region, and the source and drain regions disposed at opposite sides of the channel region. In the semiconductor layer, a primary doping operation may be performed on the channel region, and a secondary doping operation may be performed on the source and drain regions by using the gate electrode as a mask. In an exemplary embodiment, the primary doping operation may be omitted.

A first insulating layer 112 is arranged on the semiconductor layers of the first to seventh transistors T1 to T7, and the gate electrodes G1 to G7 of the first to seventh transistors T1 to T7 are arranged on the first insulating layer 112. On the same layer as the gate electrodes G1 to G7 of the first to seventh transistors T1 to T7, the first scan line 131, the second scan line 133, the third scan line 135, and the light-emission control line 137 including the same material as that of the gate electrodes G1 to G7 are arranged extending in the first direction.

The first insulating layer 112 may include an inorganic material including an oxide or a nitride. For example, the first insulating layer 112 may include an insulating material such as silicon oxide (SiO$_2$), silicon nitride (SiNx), silicon oxynitride (SiON), aluminum oxide (Al$_2$O$_3$), titanium oxide (TiO$_2$), tantalum oxide (Ta$_2$O$_5$), hafnium oxide (HfO$_2$), and zinc oxide (ZnO$_2$).

The gate electrodes G1 to G7 may each include, for example, molybdenum (Mo), copper (Cu), titanium (Ti), etc., and may include a single-layered structure or a multi-layered structure.

As shown in FIG. 6, in an exemplary embodiment, the semiconductor layer of the first transistor T1 includes a source region S1, a drain region D1, and a channel region C1 disposed between the source and drain regions S1 and D1. The gate electrode G1 of the first transistor T1 overlaps the channel region C1. Since the semiconductor layer of the first transistor T1 is curved, the channel region may be elongated, and accordingly, a driving range of a gate voltage applied to the gate electrode G1 of the first transistor T1 may be increased. The semiconductor layer of the first transistor T1 may have various shapes such as, for example, 'ㄷ', 'ㄹ', 'S', 'M', 'W', etc. The gate electrode G1 of the first transistor T1 is an island type, and overlaps the semiconductor layer of the first transistor T1 with the first insulating layer 112 disposed therebetween.

Each of the transistors T2 to T7 includes a source region, a drain region, and a channel region, similar to the first transistor T1 as described above. The source region and the drain region of a transistor may be collectively referred to as a semiconductor layer. For example, referring to FIG. 6, the layer in which the source region S1 and the drain region D1 are formed may be referred to as a first semiconductor layer of the first transistor T1.

The gate electrode G1 of the first transistor T1 is electrically connected to the drain region D4 of the fourth transistor T4 via a connection electrode 153. The connection electrode 153 is disposed on a third insulating layer 114, and may respectively contact the gate electrode G1 of the first transistor T1 and the drain region D4 of the fourth transistor T4 via a contact hole CH1 and a contact hole CH2. The contact hole CH1 is disposed in a second insulating layer 113 and the third insulating layer 114, and partially exposes the gate electrode G1 of the first transistor T1. The contact hole CH2 is disposed in the first to third insulating layers 112, 113, and 114, and partially exposes the drain region D4 of the fourth transistor T4.

In an exemplary embodiment, the semiconductor layer of the second transistor T2 includes a source region S2, a drain region D2, and a channel region disposed between the source and drain regions S2 and D2. The gate electrode G2 of the second transistor T2 overlaps the channel region of the second transistor T2, and is provided as a part of the second scan line 133. The source region S2 of the second transistor T2 is electrically connected to the first data line 161 (DL1) via a connection electrode 155. In an exemplary embodiment, the connection electrode 155 is disposed on the third insulating layer 114, and respectively contacts the source region S2 of the second transistor T2 and the first data line 161 (DL1) via a contact hole CH3 and a contact hole CH4. The contact hole CH3 is disposed in the first to third insulating layers 112, 113, and 114, and partially exposes the source region S2 of the second transistor T2. The contact hole CH4 is disposed in a fourth insulating layer 115 on the connection electrode 155, and partially exposes an upper surface of the connection electrode 155. In an exemplary embodiment, the first data line 161 (DL1) is disposed on the fourth insulating layer 115 and contacts the connection electrode 155 via the contact hole CH4. The drain region D2 of the second transistor T2 is connected to the source region S1 of the first transistor T1.

In an exemplary embodiment, the semiconductor layer of the third transistor T3 includes a source region S3, a drain region D3, and a channel region disposed between the source and drain regions S3 and D3. The gate electrode G3 of the third transistor T3 overlaps the channel region of the third transistor T3, and is provided as a part of the second scan line 133. The gate electrode G3 of the third transistor T3 may be, for example, dual gate electrodes arranged adjacent to each other in the same layer, and may have a structure in which two third sub-transistors are connected in series. Accordingly, generation of a leakage current from the third transistor T3 may be prevented or reduced.

In an exemplary embodiment, the source region S3 of the third transistor T3 is electrically connected to the gate electrode G1 of the first transistor T1 via the connection electrode 153. The connection electrode 153 is disposed on the third insulating layer 114, and may respectively contact the gate electrode G1 of the first transistor T1 and the source region S3 of the third transistor T3 via the contact hole CH1 and the contact hole CH2. The drain region D3 of the third transistor T3 is electrically connected to the drain region D1 of the first transistor T1.

In an exemplary embodiment, the semiconductor layer of the fourth transistor T4 includes a source region S4, a drain region D4, and a channel region disposed between the source and drain regions S4 and D4. The gate electrode G4 of the fourth transistor T4 overlaps the channel region of the fourth transistor T4, and is provided as a part of the first scan line 131. The gate electrode G4 of the fourth transistor T4 may be, for example, dual gate electrodes arranged adjacent to each other in the same layer, and may have a structure in which two fourth sub-transistors are connected in series. Accordingly, generation of a leakage current from the fourth transistor T4 may be prevented or reduced.

In an exemplary embodiment, the source region S4 of the fourth transistor T4 is electrically connected to the initialization voltage line 141 via a connection electrode 157. In an exemplary embodiment, the connection electrode 157 is disposed on the third insulating layer 114, and respectively contacts the source region S4 of the fourth transistor T4 and the initialization voltage line 141 via a contact hole CH5 and a contact hole CH6. In an exemplary embodiment, the contact hole CH5 is disposed in the first to third insulating layers 112, 113, and 114, and partially exposes the source region S4 of the fourth transistor T4. In an exemplary embodiment, the contact hole CH6 is disposed in the third insulating layer 114, and partially covers the initialization voltage line 141 on the second insulating layer 113. In an exemplary embodiment, the drain region D4 of the fourth transistor T4 is electrically connected to the gate electrode G1 of the first transistor T1 via the connection electrode 153. In an exemplary embodiment, the connection electrode 153 is disposed on the third insulating layer 114, and contacts the gate electrode G1 of the first transistor T1 and the drain region D4 of the fourth transistor T4 via the contact hole CH1 and the contact hole CH2. Also, the drain region D4 of the fourth transistor T4 is connected to the source region S3 of the third transistor T3.

In an exemplary embodiment, the semiconductor layer of the fifth transistor T5 includes a source region S5, a drain region D5, and a channel region disposed between the source and drain regions S5 and D5. The gate electrode G5 of the fifth transistor T5 overlaps the channel region of the fifth transistor T5, and is provided as a part of the light-emission control line 137. The source region S5 of the fifth transistor T5 is electrically connected to the driving voltage line 151. The driving voltage line 151 is disposed on the third insulating layer 114, and is electrically connected to the source region S5 of the fifth transistor T5 via a contact hole CH7. In an exemplary embodiment, the contact hole CH7 is disposed in the first to third insulating layers 112, 113, and 114, and partially exposes the source region S5 of the fifth transistor T5. The drain region D5 of the fifth transistor T5 is connected to the source region S1 of the first transistor T1.

In an exemplary embodiment, the semiconductor layer of the sixth transistor T6 includes a source region S6, a drain region D6, and a channel region disposed between the source and drain regions S6 and D6. The gate electrode G6 of the sixth transistor T6 overlaps the channel region of the sixth transistor T6, and is provided as a part of the light-emission control line 137. The source region S6 of the sixth transistor T6 is connected to the drain region D1 of the first transistor T1. The drain region D6 of the sixth transistor T6 is electrically connected to the first electrode 310 of the organic light-emitting diode OLED via a connection electrode 159. The connection electrode 159 is disposed on the third insulating layer 114, and may be connected to the drain region D6 of the sixth transistor T6 and the first electrode 310 of the organic light-emitting diode OLED respectively via a contact hole CH8 and a first via VIA1. In an exemplary embodiment, the contact hole CH8 is disposed in the first to third insulating layers 112 to 114, and partially exposes the drain region D6 of the sixth transistor T6. In an exemplary embodiment, the first via VIA1 is disposed in the fourth insulating layer 115 and partially exposes the connection electrode 159. A connection electrode 163 is arranged on the fourth insulating layer 115, and the connection electrode 163 contacts the connection electrode 159 via the first via VIA1. In an exemplary embodiment, a second via VIA2 that partially exposes a part of the connection electrode 163 is disposed in a fifth insulating layer 116 on the connection electrode 163. In an exemplary embodiment, the first electrode 310 of the organic light-emitting diode OLED contacts the connection electrode 163 via the second via VIA2.

As shown in FIG. 6, in an exemplary embodiment, the fifth insulating layer 116 is disposed on an upper surface of the first data line 161 (DL1) and the second data line 161 (DL2), and the OLED is disposed on an upper surface of the fifth insulating layer 116.

In an exemplary embodiment, the semiconductor layer of the seventh transistor T7 includes a source region S7, a drain region D7, and a channel region disposed between the source and drain regions S7 and D7. The gate electrode G7 of the seventh transistor T7 overlaps the channel region of the seventh transistor T7, and is provided as a part of the third scan line 135. The source region S7 of the seventh transistor T7 is electrically connected to the source region S4 of the fourth transistor T4. The drain region D7 of the seventh transistor T7 is electrically connected to the drain region D6 of the sixth transistor T6. The drain region D7 of the seventh transistor T7 is electrically connected to the first electrode 310 of the organic light-emitting diode OLED via a connection electrode 159.

The second insulating layer 113 is arranged on the gate electrodes G1 to G7 of the first to seventh transistors T1 to T7. The upper electrode Cst2 of the capacitor Cst is arranged on the second insulating layer 113. The initialization voltage line 141 including the same material as that of the upper electrode Cst2 of the capacitor Cst is arranged at the same layer as the upper electrode Cst2 of the capacitor Cst, extending in the first direction. Also, a shielding member 143 is arranged at the same layer as the upper electrode Cst2 of the capacitor Cst. The shielding member 143 includes the same material as that of the upper electrode Cst2 of the capacitor Cst.

The second insulating layer 113 may include, for example, an inorganic material including the above-described oxide or nitride. The upper electrode Cst2 of the capacitor Cst may include, for example, molybdenum (Mo), copper (Cu), aluminum (Al), titanium (Ti), etc., and may include, for example, a single-layered structure or a multi-layered structure.

The capacitor Cst overlaps the first transistor T1. The capacitor Cst includes the lower electrode Cst1 and the upper electrode Cst2. The lower electrode Cst1 of the capacitor Cst is the gate electrode G1 of the first transistor T1. For example, in an exemplary embodiment, the lower electrode Cst1 of the capacitor Cst and the gate electrode G1 of the first transistor T1 are integrated with each other. The lower electrode Cst1 of the capacitor Cst is separated from adjacent pixels and has a square shape, and is arranged at the same layer as those of the first scan line 131, the second scan line 133, the third scan line 135, and the light-emission control line 137. In an exemplary embodiment, the lower electrode Cst1 of the capacitor Cst, the first scan line 131, the second scan line 133, the third scan line 135, and the light-emission control line 137 are formed of the same material. The upper electrode Cst2 of the capacitor Cst entirely covers the lower electrode Cst1, and overlaps the lower electrode Cst1 of the capacitor Cst with the second insulating layer 113 disposed therebetween. Here, the second insulating layer 113 may act as a dielectric layer of the capacitor Cst. In an exemplary embodiment, the upper electrode Cst2 of the capacitor Cst includes an opening SOP. The opening SOP is obtained by partially removing the upper electrode Cst at a location corresponding to the contact hole CH1 that partially exposes the lower electrode Cst1. The opening SOP may have a closed curve shape. In an exemplary embodiment, the connection electrode 153 is connected to the lower electrode Cst1 via the contact hole CH1 arranged in the opening SOP. In an exemplary embodiment, the upper electrode Cst2 is electrically connected to the driving voltage line 151 via a contact hole CH9, which may be disposed in the third insulating layer 114.

Referring to FIG. 8, in an exemplary embodiment, the shielding member 143 is electrically connected to the driving voltage line 151 via a contact hole CH10. In an exemplary embodiment, the shielding member 143 is arranged to at least partially overlap the semiconductor layer thereunder and the driving voltage line 151 and the connection electrode 153 thereon.

In an exemplary embodiment, the shielding member 143 is arranged on a layer between the layer at which one of the source region S3 and the drain region D3 of the third transistor T3 (the source region S3 in FIG. 4) is arranged and the layer at which the driving voltage line 151 is arranged, as shown in region X in FIGS. 7 and 8, to prevent generation of a parasitic capacitance due to the source region S3 of the third transistor T3 and the driving voltage line 151. Accordingly, fluctuation of the voltage at the gate electrode G1 of the first transistor T1, which is connected to the source region S3 of the third transistor T3, may be prevented.

In an exemplary embodiment, the shielding member 143 is arranged on a layer between the layer at which one of the source region S4 and the drain region D4 of the fourth transistor T4 (the drain region D4 of FIG. 4) is arranged and the layer at which the connection electrode 155 is arranged, as shown in region Y in FIGS. 7 and 8, to prevent generation of a parasitic capacitance due to the drain region D4 of the fourth transistor T4 and the connection electrode 155. Accordingly, fluctuation of the voltage at the gate electrode G1 of the first transistor T1, which is connected to the drain region D4 of the fourth transistor T4, may be prevented.

The third insulating layer 114 is arranged on the upper electrode Cst2 of the capacitor Cst and the shielding member 143. The driving voltage line 151 and the connection electrodes 153, 155, 157, and 159 may be arranged on the third insulating layer 114.

The third insulating layer 114 may include, for example, an inorganic material as described above.

The driving voltage line 151 and the connection electrodes 153, 155, 157, and 159 may include a material having high conductivity such as, for example, metal, conductive oxide, etc. For example, the driving voltage line 151 and the connection electrodes 153, 155, 157, and 159 may have a single-layered structure or a multi-layered structure including Al, Cu, Ti, etc. In exemplary embodiments, the driving voltage line 151 and the connection electrodes 153, 155, 157, and 159 may have a triple-layered structure in which, for example, Ti, Al, and T1 are sequentially arranged (Ti/Al/Ti).

In an exemplary embodiment, the fourth insulating layer 115 is arranged on the driving voltage line 151 and the connection electrodes 153, 155, 157, and 159, and the first data line 161 (DL1), the second data line 161 (DL2), and the connection electrode 163 are arranged on the fourth insulating layer 115.

The fourth insulating layer 115 may include an organic material such as, for example, acryl, benzocyclobutene (BCB), polyimide, hexamethyldisiloxane (HMDSO), etc. Alternatively, the fourth insulating layer 115 may include an inorganic material as described above. The thickness of the fourth insulating layer 115 may be greater than a thickness of a wiring arranged on a lower layer thereof, thereby reducing a parasitic capacitance between the wiring (e.g., data line) arranged on the upper layer of the fourth insulating layer 115 and the wiring (e.g., driving voltage line) arranged on the lower layer of the fourth insulating layer 115.

The first data line 161 (DL1), the second data line 161 (DL2), and the connection electrode 163 may include a material having high conductivity such as, for example, metal, conductive oxide, etc. For example, the first data line 161 (DL1), the second data line 161 (DL2), and the connection electrode 163 may have a single-layered structure or a multi-layered structure including, for example, Al, Cu, Ti, etc. In exemplary embodiments, the first data line 161 (DL1), the second data line 161 (DL2), and the connection electrode 163 may have a triple-layered structure in which, for example, titanium, aluminum, and titanium are sequentially arranged (Ti/Al/Ti).

The first data line 161 (DL1) and the second data line 161 (DL2) extend in the second direction. As shown in FIG. 3, the first data line 161 (DL1) and the second data line 161 (DL2) are disposed on opposite sides of the pixel PX. For example, in an exemplary embodiment, the first data line 161 (DL1) is arranged at a left side of the pixel PX and the second data line 161 (DL2) is arranged at a right side of the pixel PX in a plan view. In an exemplary embodiment, the first data line 161 (DL1) is arranged at the left of the first transistor T1 and the capacitor Cst, and the second data line 161 (DL2) is arranged at the right of the first transistor T1 and the capacitor Cst.

The first data line 161 (DL1) is connected to the second transistor T2 of the pixel PX in an odd-numbered row, and the second data line 161 (DL2) is connected to the second transistor T2 of the pixel PX in an even-numbered row. FIG. 4 shows an example in which the first data line 161 (DL1) of the first and second data lines 161 (DL1 and DL2) is connected to the second transistor T2. That is, the pixel PX shown in FIG. 4 may be a pixel of an odd-numbered row.

In an exemplary embodiment, the fifth insulating layer 116 is arranged on the first and second data lines 161 (DL1 and DL2) and the connection electrode 163. The first via VIA1 that partially exposes the connection electrode 163 is disposed in the fifth insulating layer 116. The connection electrode 163 contacts the connection electrode 159 via the first via VIAL The fifth insulating layer 116 may include an organic material such as, for example, acryl, BCB, polyimide, HMDSO, etc. Alternatively, the fifth insulating layer 116 may include an inorganic material as described above.

The fourth insulating layer 115 and the fifth insulating layer 116 function as a protective layer covering a pixel circuit, and are arranged to have substantially flat upper surfaces. The fourth insulating layer 115 and the fifth insulating layer 116 may each have a single-layered structure or a multi-layered structure. The fourth insulating layer 115 and the fifth insulating layer 116 may include a material having low permittivity.

In an exemplary embodiment, the organic light-emitting diode OLED is disposed on the fifth insulating layer 116. In an exemplary embodiment, the organic light-emitting diode OLED includes the first electrode (pixel electrode) 310, a second electrode (opposite electrode) 350, and an intermediate layer 330 disposed between the first electrode 310 and the second electrode 350. In an exemplary embodiment, a sixth insulating layer 117 that covers an edge of the first electrode 310 is arranged on the fifth insulating layer 116. The sixth insulating layer 117 may have an opening that partially exposes the first electrode 310 to define pixels.

In an exemplary embodiment, the first electrode 310 of the organic light-emitting diode OLED contacts the connection electrode 163 through the second via VIA2. The first electrode 310 may be a reflective layer including a reflective and conductive material such as, for example, silver (Ag), magnesium (Mg), aluminum (Al), platinum (Pt), lead (Pd), gold (Au), nickel (Ni), neodymium (Nd), iridium (Ir), chrome (Cr), and a compound thereof. In an exemplary embodiment, the first electrode 310 may be a transparent conductive layer including at least one transparent conductive oxide selected from the group consisting of indium tin oxide (ITO), indium zinc oxide (IZO), zinc oxide (ZnO), indium oxide ($In_2O_3$), indium gallium oxide, and aluminum zinc oxide (AZO). In an exemplary embodiment, the first electrode 310 has a stack structure including the reflective layer and the transparent conductive layer.

The sixth insulating layer 117 may include an organic material such as, for example, acryl, BCB, polyimide, HMDSO, etc.

The intermediate layer 330 of the organic light-emitting diode OLED may include at least an emission layer (EML), and may further include at least one of functional layers such as, for example, a hole injection layer (HIL), a hole transport layer (HTL), an electron transport layer (ETL), and an electron injection layer (EIL). The EML may be a red emission layer, a green emission layer, or a blue emission layer. Alternatively, the EML may have a multi-layered structure in which the red emission layer, the green emission layer, and the blue emission layer are stacked, or a single-layered structure including a red emission material, a green emission material, and a blue emission material, for emitting white light. In the drawings, for convenience of illustration, the intermediate layer 330 of the organic light-emitting diode OLED is patterned to only correspond to the first electrode 310. However, exemplary embodiments of the present disclosure are not limited thereto. For example, in an exemplary embodiment, the intermediate layer 330 may be integrally provided with another intermediate layer 330 of an adjacent pixel. Also, in an exemplary embodiment, some layers of the intermediate layer 330 are provided respectively for pixels, and the other layers are integrally provided with the intermediate layers 330 of adjacent pixels.

The second electrode 350 of the organic light-emitting diode OLED may include various conductive materials. For example, the second electrode 350 may include a semi-transmitting reflective layer including at least one of lithium (Li), calcium (Ca), lithium fluoride (LiF), Al, Mg, and Ag, or may include a light-transmitting metal oxide such as ITO, IZO, ZnO, etc. in a single-layered structure or a multi-layered structure.

In an exemplary embodiment, a thin film encapsulation layer may be arranged on the organic light-emitting diode OLED. The thin film encapsulation layer may cover the pixel portion 100 and may extend to an outer portion of the pixel portion 100. The thin film encapsulation layer may include an inorganic encapsulation layer including at least one inorganic material and an organic encapsulation layer including at least one organic material. In exemplary embodiments, the thin film encapsulation layer may have a structure in which a first inorganic encapsulation layer, an organic encapsulation layer, and a second inorganic encapsulation layer are stacked.

In exemplary embodiments, a spacer may be further provided on the sixth insulating layer 117 for preventing a dent in the mask, and various functional layers such as a polarization layer for reducing external light reflection, a black matrix, a color filter, and/or a touch screen layer including a touch electrode may be provided on the thin film encapsulation layer.

Figure 9:
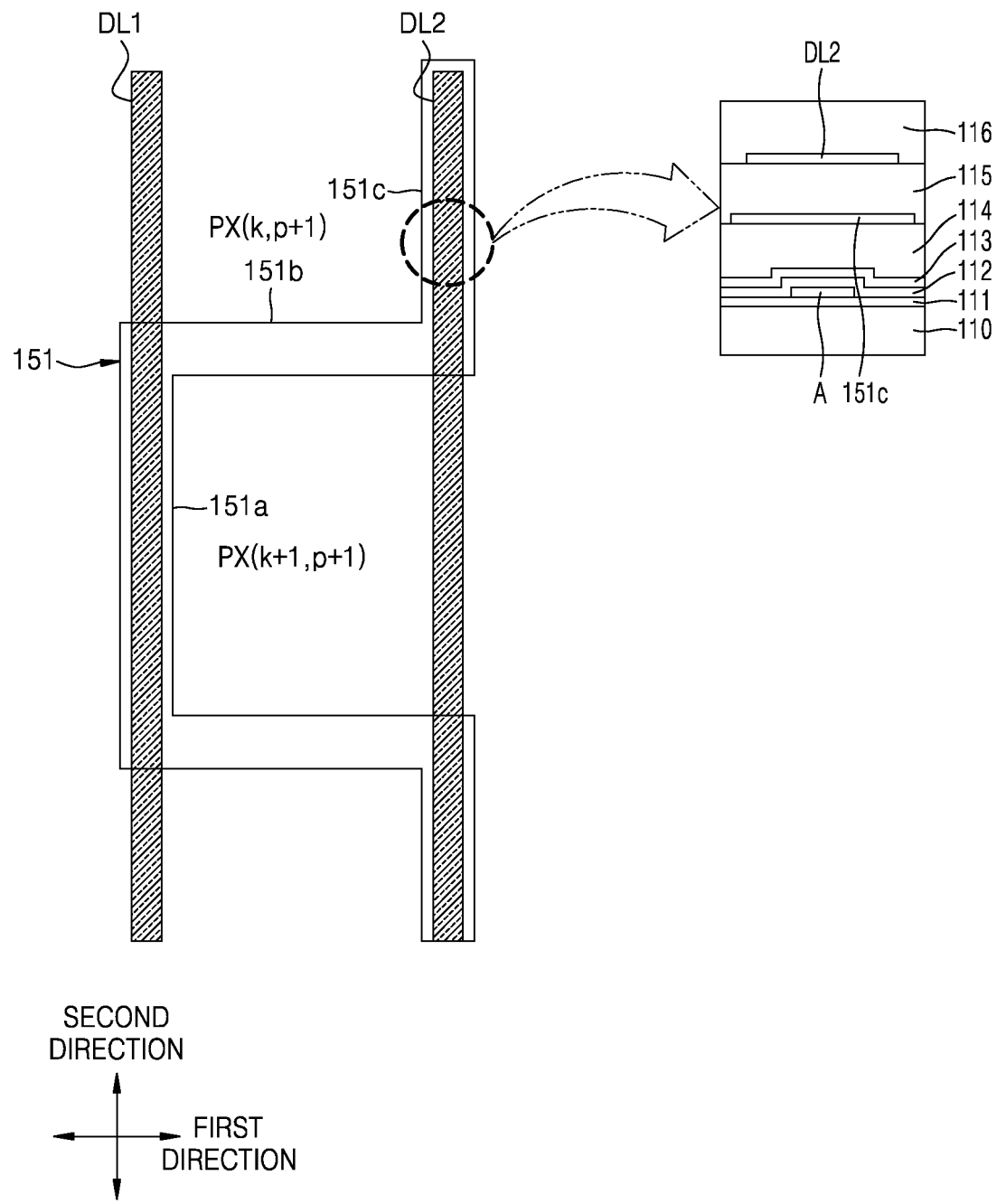
FIG. 9 is a schematic diagram showing a relationship between arrangements of a data line and a driving voltage line in the pixel of FIG. 4.

FIG. 9 is a schematic diagram showing a relationship between arrangements of a data line and a driving voltage line in the pixel of FIG. 4.

Referring to FIG. 9, in an exemplary embodiment, the first data line 161 (DL1) extends in the second direction at the left side of the pixel PX, and the second data line 161 (DL2) extends in the second direction at the right side of the pixel PX. In an exemplary embodiment, the driving voltage line 151 is arranged on a lower layer of the first data line 161 (DL1) and the second data line 161 (DL2).

In an exemplary embodiment, the driving voltage line 151 is arranged in a zig-zag formation. In an exemplary embodiment, the driving voltage line 151 includes a first region 151a that extends in the second direction and that overlaps the first data line 161 (DL1) on the lower layer of the first data line 161 (DL1), a third region 151c that extends in the second direction and that overlaps the second data line 161 (DL2) on the lower layer of the second data line 161 (DL2), and a second region 151b that extends in the first direction between the first data line 161 (DL1) and the second data line 161 (DL2) and that connects the first and third regions 151a and 151c to each other. In an exemplary embodiment, the second region 151b is arranged between two adjacent rows.

As shown in FIG. 9, in an exemplary embodiment, a single driving voltage line 151 is shaped and extends such that it at least partially overlaps both the first data line DL1 and the second data line DL2 disposed on the left and right side of a pixel PX.

Semiconductor layers A of some of the first to seventh transistors T1 to T7 may be arranged under the first and third regions 151a and 151c of the driving voltage line 151.

The first and third regions 151a and 151c of the driving voltage line 151 may function as a shielding member for preventing generation of a parasitic capacitance between the semiconductor layers A and the first and second data lines 161 (DL1 and DL2) that are arranged at different upper and lower layers from each other.

Figure 10:
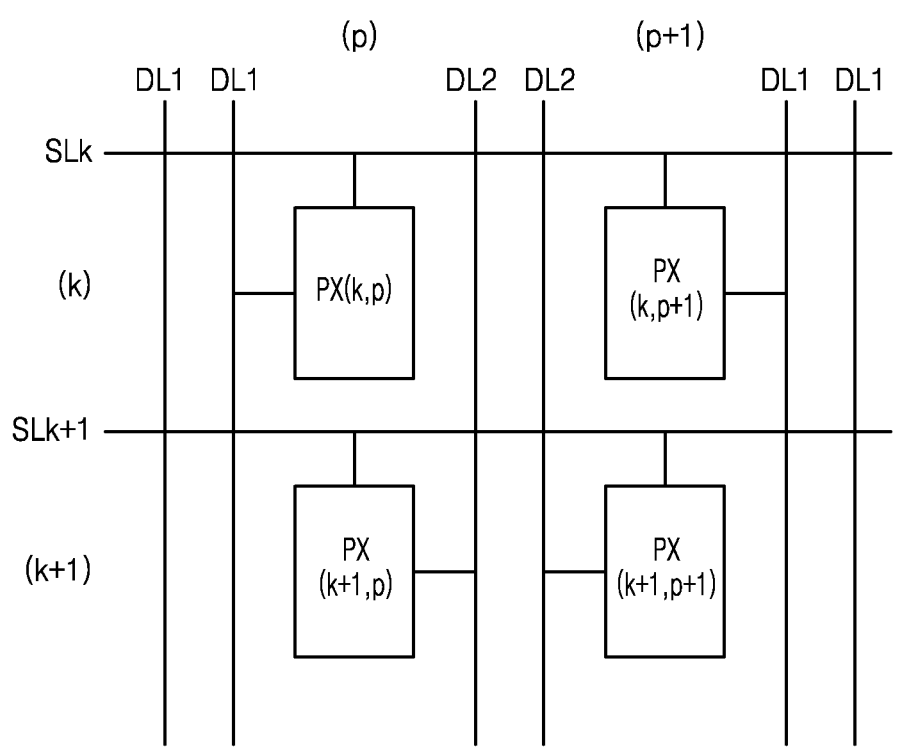
FIG. 10 is a schematic diagram of a pixel arrangement according to an exemplary embodiment of the present disclosure.

FIG. 10 is a schematic diagram of a pixel arrangement according to an exemplary embodiment of the present disclosure.

FIG. 10 shows a pixel PX(k,p) in a row k and a column p, a pixel PX(k,p+1) in the row k and a column p+1, a pixel PX(k+1,p) in a row k+1 and the column p, and a pixel PX(k+1,p+1) in the row k+1 and the column p+1. Here, k and p are respectively odd numbers.

Referring to FIG. 10, in an exemplary embodiment, pixel circuits of the pixel PX connected to a scan line SLk of an odd-numbered row and the pixel PX connected to a scan line SLk+1 of an even-numbered row in each column are symmetric with each other. For example, arrangements of the first to seventh transistors T1 to T7 in the pixel PX(k,p) and the pixel PX(k+1,p) are laterally opposite each other, and arrangements of the first to seventh transistors T1 to T7 in the pixel PX(k,p+1) and in the pixel PX(k+1,p+1) are laterally opposite each other. However, connection relations among the first to seventh transistors T1 to T7 and the capacitor Cst are equivalent. Also, pixel circuits of a pair of pixels PX arranged in the same row and adjacent columns may be laterally symmetric with each other. For example, arrangements of the first to seventh transistors T1 to T7 in the pixel PX(k,p) and the pixel PX(k,p+1) are laterally opposite each other, and arrangements of the first to seventh transistors T1 to T7 in the pixel PX(k+1,p) and in the pixel PX(k+1,p+1) are laterally opposite each other. However, connection relations among the first to seventh transistors T1 to T7 and the capacitor Cst are equivalent.

In each column, the first data line DL1 and the second data line DL2 are arranged to be spaced apart from each other. A pair of the first data lines DL1 or a pair of the second data lines DL2 may be arranged adjacent to each other between two adjacent columns.

Figure 11:
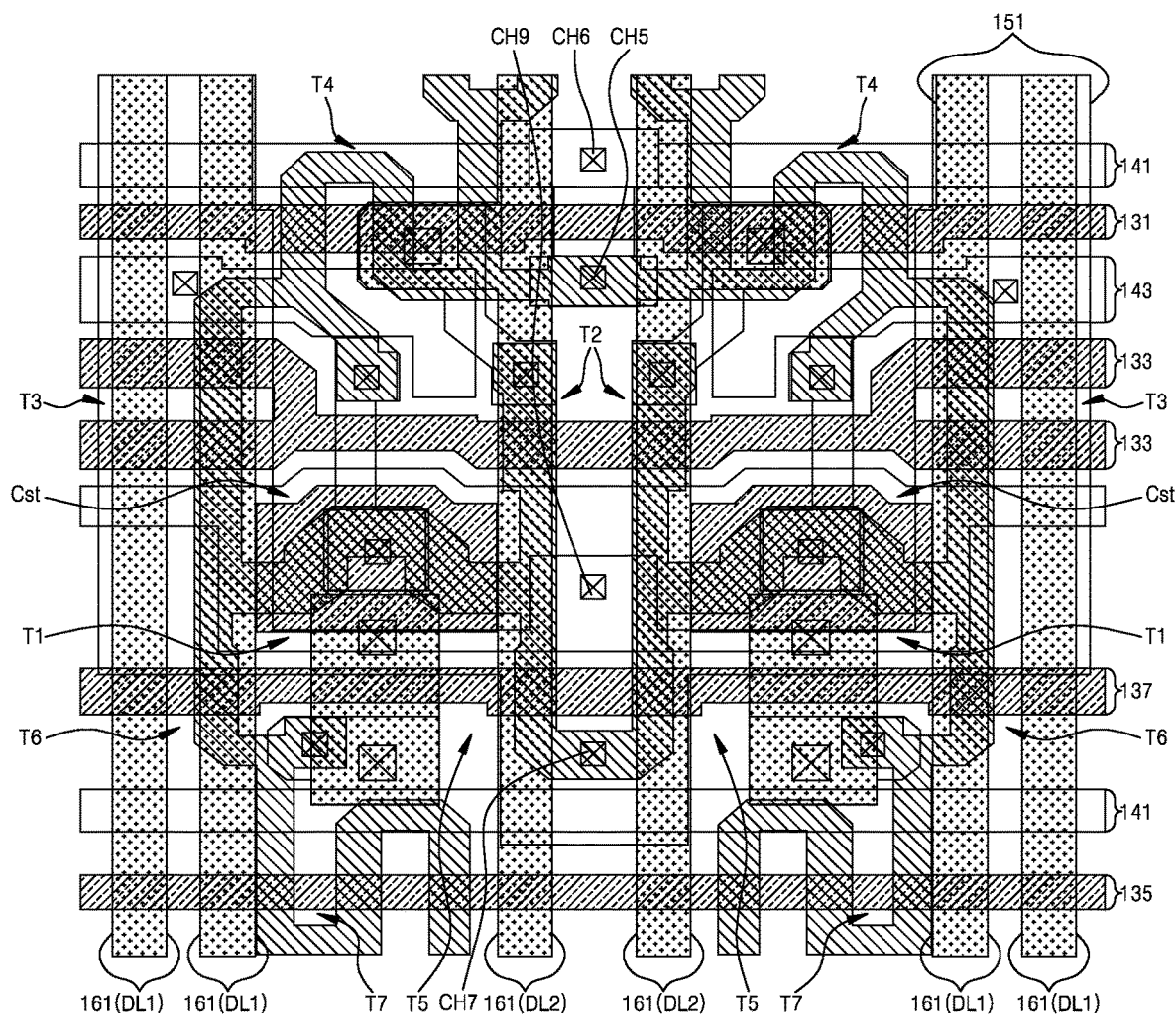
FIG. 11 is a diagram schematically showing locations of a transistor and a capacitor in the pixel of FIGS. 2 and 10.
Figure 12:
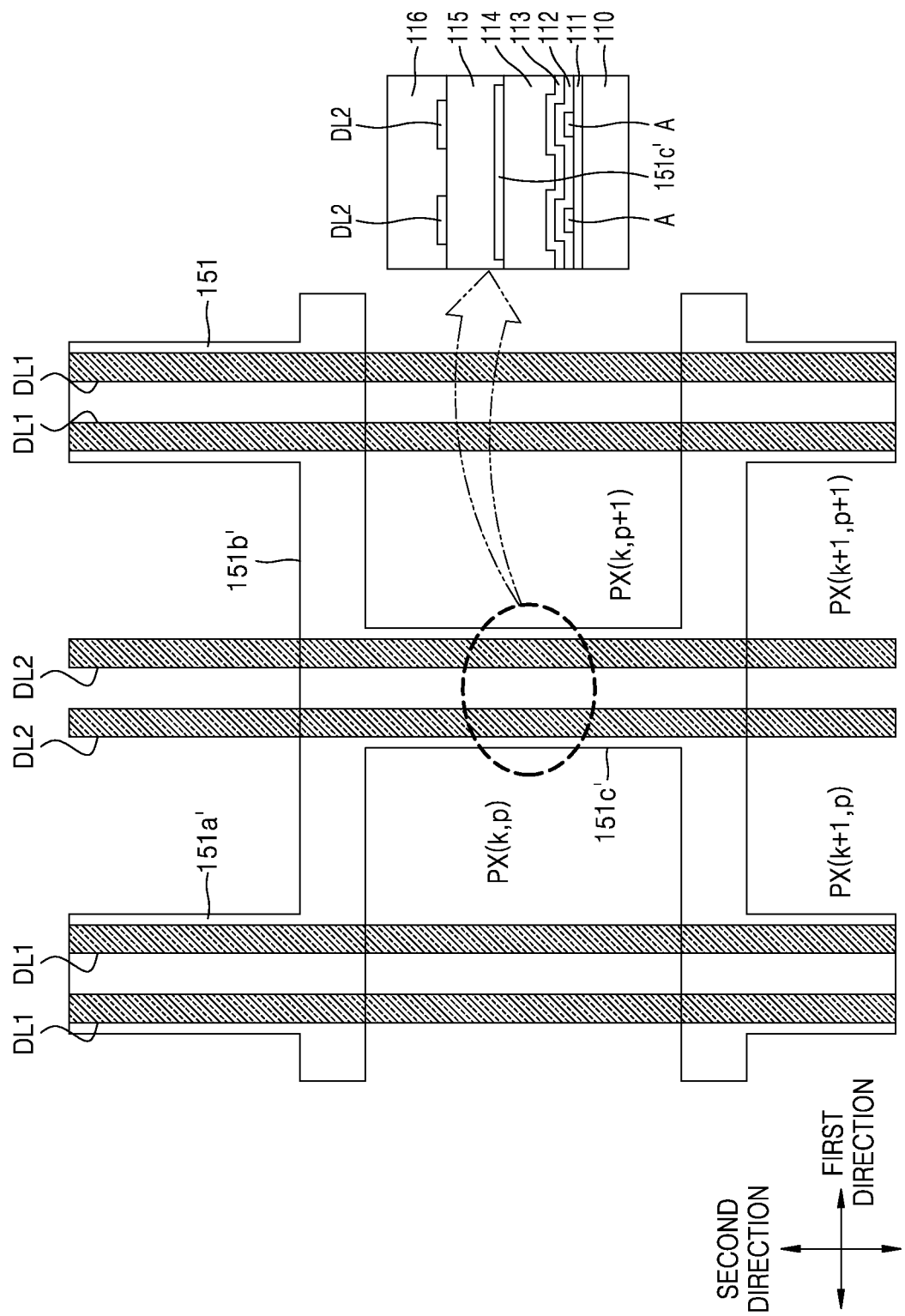
FIG. 12 is a schematic diagram showing a relationship between arrangements of a data line and a driving voltage line in the pixel of FIG. 11.

FIG. 11 is a diagram schematically showing locations of a transistor and a capacitor in the pixel of FIGS. 2 and 10. FIG. 12 is a schematic diagram showing a relationship between arrangements of a data line and a driving voltage line in the pixel of FIG. 11. Hereinafter, for convenience of explanation, a further description of the same components as those previously described with reference to FIG. 4 may be omitted.

Referring to FIGS. 11 and 12, the first data line 161 (DL1) and the second data line 161 (DL2) extend in the second direction respectively at the left and right sides of each pixel PX in each column. A pair of first data lines 161 (DL1) or a pair of second data lines 161 (DL2) are alternately arranged between adjacent columns. The driving voltage line 151 may be arranged under the first data line 161 (DL1) and the second data line 161 (DL2).

The driving voltage line 151 shown in the exemplary embodiment of FIGS. 3 and 4 is arranged in a zig-zag formation through the pixels. The driving voltage line 151 shown in the exemplary embodiment of FIGS. 10 to 12 is shared by adjacent pixels in the same row.

The driving voltage line 151 is arranged in the second direction. In an exemplary embodiment, the driving voltage line 151 includes a first region 151a' that extends in the second direction on the lower layer of the pair of first data lines 161 (DL1) and overlaps the first data lines 161 (DL1), a third region 151c' that extends in the second direction on the lower layer of the pair of second data lines 161 (DL2) and overlaps the second data lines 161 (DL2), and a second region 151b' that extends in the first direction and connects the first and third regions 151a' and 151c' to each other between the pair of first data lines 161 (DL1) and the pair of second data lines 161 (DL2). The second region 151b' may be arranged between two adjacent rows. The data lines corresponding to the first and third regions 151a' and 151c' of the driving voltage line 151 are not connected to a pixel of a corresponding row.

In an exemplary embodiment, the first region 151a' of the driving voltage line 151 has a width that is greater than the total width of the pair of first data lines 161 (DL1) and an interval between the pair of first data lines 161 (DL1). For example, in an exemplary embodiment, the width of the first region 151a' is greater than the sum of the widths of each of the pair of first data lines 161 (DL1) and the width of the interval between the pair of the first data lines 161 (DL1). Similarly, in an exemplary embodiment, the third region 151c' of the driving voltage line 151 has a width that is greater than the total width of the pair of second data lines 161 (DL2) and an interval between the pair of second data lines 161 (DL2). For example, in an exemplary embodiment, the width of the third region 151c' is greater than the sum of the widths of each of the pair of second data lines 161 (DL1) and the width of the interval between the pair of the second data lines 161 (DL1).

Semiconductor layers A of some of the first to seventh transistors T1 to T7 may be arranged under the first and third regions 151a' and 151c' of the driving voltage line 151.

The first and third regions 151a' and 151c' of the driving voltage line 151 may function as a shielding member for preventing generation of a parasitic capacitance between the semiconductor layers A and the first and second data lines 161 (DL1 and DL2) that are arranged at different upper and lower layers from each other.

In an exemplary embodiment, the second region 151b' of the driving voltage line 151 is electrically connected to the upper electrode Cst2 of the capacitor Cst via the contact hole CH9. The upper electrodes Cst2 of the capacitors Cst in neighboring pixels of the same row are connected to each other. Accordingly, in an exemplary embodiment, the second region 151b' of the driving voltage line 151 and the upper electrode Cst2 of the capacitor Cst function as power lines extending in the first direction, and the first region 151a' and the third region 151c' of the driving voltage line 151 function as power lines extending in the second direction. Accordingly, the first, second, and third regions 151a', 151b' and 151c' of the driving voltage line 151 and the upper electrode Cst2 of the capacitor Cst may also be referred to herein as power lines. Thus, in an exemplary embodiment, the driving voltage line 151 may have an entirely mesh structure.

Although the data lines are arranged on an upper layer of the driving voltage line in the above-described exemplary embodiments, the present disclosure is not limited thereto. For example, in an exemplary embodiment, the driving voltage line and the data lines are arranged on different layers from each other. For example, the driving voltage line may be arranged on an upper layer of the data lines.

According to exemplary embodiments of the present disclosure, two data lines are arranged in one pixel, and the pixel of the odd-numbered row and the pixel of the even-numbered row are connected to one of the two data lines. Thus, according to exemplary embodiments of the present disclosure, a sufficient amount of time for compensating for the threshold voltage and a sufficient amount of time for storing data signals is provided in a display apparatus having high resolution and/or high driving frequency.

According to exemplary embodiments of the present disclosure, the first data line DL1 and the second data line DL2 are disposed between the layer at which the driving voltage line is arranged and the layer at which the first electrode of the organic light-emitting diode OLED is arranged. For example, referring to FIG. 6, in an exemplary embodiment, the first data line 161 (DL1) and the second data line 161 (DL2) are disposed between the driving voltage line 151 and the first electrode 310 of the organic light-emitting diode OLED. According to exemplary embodiments of the present disclosure, an insulating layer is disposed between a layer on which the first data line DL1 and the second data line DL2 are arranged and a layer on which the driving voltage line is arranged. For example, referring to FIG. 6, in an exemplary embodiment, the fourth insulating layer 115 is disposed between the first data line 161 (DL1) and the driving voltage line 151 and between the second data line 161 (DL2) and the driving voltage line 151. Thus, in exemplary embodiments, since the driving voltage line and the data lines are not arranged on the same layer, but are instead arranged on different layers from each other, intervals between the two data lines may be sufficiently ensured even when two data lines are arranged in each column. Accordingly, a cross torque between the two data lines may be reduced, and the capacity of the capacitor may be ensured.

According to exemplary embodiments of the present disclosure, the driving voltage line is arranged to overlap with the data line and adjacent wirings under the data line at least partially on a plane and a cross-section. Accordingly, the parasitic capacitance between the data lines and the adjacent wirings under the data lines may be reduced.

According to exemplary embodiments of the present disclosure, two data lines are arranged in each column, and the driving of the pixels in the odd-numbered row and the pixels of the even-numbered row are separated. Thus, according to exemplary embodiments, a sufficient amount of time for compensating for the threshold voltage of the driving transistor and a sufficient amount of time for storing the data signals are sufficiently ensured while displaying high resolution images.

While the present disclosure has been particularly shown and described with reference to the exemplary embodiments thereof, it will be understood by those of ordinary skill in the art that various changes in form and detail may be made therein without departing from the spirit and scope of the present disclosure as defined by the following claims.

What is claimed is:

1. A display apparatus, comprising:
a first pixel in a first column and comprising a first driving transistor;
a second pixel adjacent to the first pixel in a second column adjacent to the first column and comprising a second driving transistor;
a first data line disposed at a left side of the first driving transistor in the first column;
a second data line disposed at a right side of the first driving transistor in the first column;
a third data line disposed at a left side of the second driving transistor in the second column;
a fourth data line disposed at a right side of the second driving transistor in the second column; and
a driving voltage line parallel to the first data line and the second data line in the first column and at least partially overlapping the first data line or the second data line in the first column,
wherein the first pixel is electrically connected to one of the first data line and the second data line, and the second pixel is electrically connected to one of the third data line and the fourth data line, and
wherein the first data line and the second data line are disposed in a layer between the driving voltage line and a pixel electrode.

2. The display apparatus of claim 1, further comprising:
a first insulating layer disposed between the first data line and the driving voltage line and between the second data line and the driving voltage line, and wherein the first insulating layer comprises an organic material.

3. The display apparatus of claim 1, wherein the driving voltage line comprises a first region that overlaps the first data line in a first row, a third region that overlaps the second data line in a second row that is adjacent to the first row, and a second region that connects the first region to the third region between the first row and the second row.

4. The display apparatus of claim 1, further comprising:
a second insulating layer disposed on the first data line and the second data line; and
a light-emitting device disposed on the second insulating layer.

5. The display apparatus of claim 4, wherein the second insulating layer comprises an organic material.

6. The display apparatus of claim 1, wherein the first data line, the second data line, and the driving voltage line comprise a same material.

7. The display apparatus of claim 1, wherein the first data line and the second data line comprise a material that is different from a material included in the driving voltage line.

8. The display apparatus of claim 1, further comprising:
a transistor comprising a semiconductor layer and a gate electrode, wherein the semiconductor layer of the transistor comprises a source region and a drain region;
a connection electrode disposed adjacent to the semiconductor layer of the transistor; and
a shielding member that at least partially overlaps the connection electrode and at least one of the source region and the drain region of the semiconductor layer of the transistor,
wherein the source region or the drain region of the semiconductor layer of the transistor is electrically connected to the first gate electrode of the first driving transistor.

9. The display apparatus of claim 8, wherein the shielding member is electrically connected to the driving voltage line.

10. The display apparatus of claim 8, wherein the shielding member is disposed between the semiconductor layer of the transistor and the connection electrode, and a plurality of insulating layers are disposed between the semiconductor layer of the transistor and the shielding member and between the connection electrode and the shielding member.

11. The display apparatus of claim 1, wherein the first data line, the second data line, and the driving voltage line comprise metal.

12. A display apparatus, comprising:
a first pixel in a first column and comprising a first driving transistor, the first driving transistor comprising a first semiconductor layer and a first gate electrode;
a second pixel adjacent to the first pixel in the first column and comprising a second driving transistor, the second driving transistor comprising a second semiconductor layer and a second gate electrode;
a first data line disposed at a left side of the first driving transistor and the second driving transistor in the first column, and electrically connected to one of the first pixel and the second pixel;
a second data line disposed at a right side of the first driving transistor and the second driving transistor in the first column, and electrically connected to the other of the first pixel and the second pixel;
a driving voltage line that at least partially overlaps the first data line and the second data line;
a first insulating layer disposed between the first data line and the driving voltage line and between the second data line and the driving voltage line;

a first capacitor that overlaps the first driving transistor and is disposed between the first data line and the second data line; and a second capacitor that overlaps the second driving transistor and is disposed between the first data line and the second data line.

13. The display apparatus of claim 12, wherein each of the first capacitor and the second capacitor comprises a lower electrode and an upper electrode, and the lower electrode of the first capacitor is at least a part of the first gate electrode of the first driving transistor, and the lower electrode of the second capacitor is at least a part of the second gate electrode of the second driving transistor.

14. The display apparatus of claim 13, wherein the upper electrodes of the first capacitor and the second capacitor are electrically connected to the driving voltage line.

15. The display apparatus of claim 14, wherein the upper electrodes of the first capacitor and the second capacitor are disposed below the driving voltage line.

16. A display apparatus, comprising:
- a first transistor comprising a first semiconductor layer and a first gate electrode, wherein the first semiconductor layer comprises a source region and a drain region;
- a first data line disposed at a left side of the first transistor;
- a second data line disposed at a right side of the first transistor;
- a driving voltage line that at least partially overlaps the first data line and the second data line;
- a first insulating layer disposed between the first data line and the driving voltage line and between the second data line and the driving voltage line,
- wherein the first data line and the second data line are disposed in a same column; and
- a capacitor that overlaps the first transistor and is disposed between the first data line and the second data line,
- wherein the capacitor comprises a lower electrode and an upper electrode, and the lower electrode is at least a part of the first gate electrode of the first transistor,
- wherein the upper electrode of the capacitor is electrically connected to the driving voltage line,
- wherein the upper electrode of the capacitor is disposed below the driving voltage line.

* * * * *